(12) United States Patent
Foxall (10) Patent No.: US 7,948,235 B2
(45) Date of Patent: May 24, 2011

(54) LOW POWER BROADBAND SPIN DECOUPLING

(75) Inventor: David L. Foxall, Mentor, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 336 days.

(21) Appl. No.: 12/295,942

(22) PCT Filed: Mar. 16, 2007

(86) PCT No.: PCT/US2007/064189
§ 371 (c)(1),
(2), (4) Date: Oct. 3, 2008

(87) PCT Pub. No.: WO2007/121021
PCT Pub. Date: Oct. 25, 2007

(65) Prior Publication Data
US 2009/0096449 A1 Apr. 16, 2009

Related U.S. Application Data

(60) Provisional application No. 60/744,606, filed on Apr. 11, 2006.

(51) Int. Cl.
*G01V 3/00* (2006.01)
(52) U.S. Cl. .................................. 324/307; 324/309
(58) Field of Classification Search ......... 324/307, 324/309
See application file for complete search history.

(56) References Cited

U.S. PATENT DOCUMENTS

| | | | |
|---|---|---|---|
| 3,588,678 A | 6/1971 | Ernst | |
| 3,786,341 A | 1/1974 | Anderson et al. | |
| 4,327,425 A | 4/1982 | Ernst et al. | |
| 4,443,761 A | 4/1984 | Levitt | |
| 4,682,106 A | 7/1987 | Vatis et al. | |
| 4,959,612 A | 9/1990 | Luyten | |
| 5,043,664 A | 8/1991 | Kunz | |
| 5,581,182 A * | 12/1996 | Fu et al. | 324/309 |
| 6,064,207 A | 5/2000 | Kupce | |
| 6,184,683 B1 * | 2/2001 | Emsley et al. | 324/309 |
| 6,888,348 B2 * | 5/2005 | Kupce | 324/307 |

OTHER PUBLICATIONS

Barker, P. B., et al.; Broadband Proton Decoupling for In Vivo Brain Spectroscopy in Humans; 2001; Magnetic Resonance in Medicine; 45:226-232.

de Graaf, R. A.; Theoretical and Experimental Evaluation of Broadband Decoupling Techniques for in Vivo Nuclear Magnetic Resonance Spectroscopy; 2005; Magnetic Resonance in Medicine; 53:1297-1306.

Freeman, R., et al.; Decoupling: Theory and Practice I. Current Methods and Recent Concepts; 1997; NMR in Biomedicine; vol. 10:372-380.

(Continued)

*Primary Examiner* — Louis M Arana (57) ABSTRACT

In a magnetic resonance data acquisition method, magnetic resonance is excited (72, 74) in an observed nuclear species. Magnetic resonance data of the observed nuclear species are acquired (76). A plurality of different broadband decoupling radio frequency pulses (80) configured to decouple a coupled nuclear species from the observed nuclear species are applied. Each broadband decoupling radio frequency pulse has a different or randomized or pseudorandomized amplitude (110) as a function of time. Each broadband decoupling radio frequency pulse has about the same peak power, pulse duration, and frequency spread. The differences between the broadband decoupling radio frequency pulses are effective to substantially suppress cycling sidebands.

19 Claims, 9 Drawing Sheets

OTHER PUBLICATIONS

Green, H.; Theoretical design of amplitude-modulated pulses for spin decoupling in nuclear magnetic resonance; 1996; J. Phys. B: At. Mol. Opt. Phys.; 29:1699-1710.

Hwang, T., et al.; Reduction of sideband intensities in adiabatic decoupling using modulation generated through adiabatic R-variation (MGAR); 1996; J. of Magnetic Resonance, Series A; 121:221-226.

Shaka, A. J., et al.; Cycling sidebands in broadband decoupling; 1986; J. of Magnetic Resonance; 67:396-401.

Shaka, A. J., et al.; Broadband spin decoupling in isotropic-liquids; 1987; Progress in NMR Spectroscopy; 19:47-129.

Basus, et al., "Utilization of Chirp Frequency Modulation with 180°-Phase Modulation For Heteronuclear Spin Decoupling", Journal of Magnetic Resonance 35, 19-37 (1979).

Levitt, et al., "Compensation For Pulse Imperfections in NMR Spin-Echo Experiments", Journal of Magnetic Resonance 43, 65-80 (1981).

Shaka, et al., "Computer-Optimized Decoupling Scheme for Wideband Applications and Low-Level Operation", Journal of Magnetic Resonance 64, 547-552 (1985).

Fujiwara, et al., "Composite Inversion Pulses with Frequency Switching and Their Application To Broadband Decoupling", Journal of Magnetic Resonance 77, 53-63 (1988).

Bendall, "Broadband and Narrowband Spin Decoupling Using Adiabatic Spin Flips", Journal of Magnetic Resonance, Series A 112, 126-129 (1995).

Starcuk, et al., "Heteronuclear Broadband Spin-Flip Decoupling with Adiabatic Pulses" Journal of Magnetic Resonance, Series A 107, 24-31 (1994).

Fu, et al., "Ultra-Broadband Decoupling", Journal of Magnetic Resonance, Series A, 117, 324-325 (1995).

Kupce, et al., "Stretched Adiabatic Pulses for Broadband Spin Inversion", Journal of Magnetic Resonance, Series A, 117, 246-256 (1995).

Kupce, et al., "Figure of Merit and Cycling Sidebands in Adiabatic Decoupling" Journal of Magnetic Resonance, Series A 120, 264-268 (1996).

Adriany, et al., "A Half-Volume Coil for Efficient Proton Decoupling in Humans at 4 Tesla", Journal of Magnetic Resonance 125, 178-184 (1997).

Tannus, et al., "Improved Performance of Frequency-Swept Pulses Using Offset-Independent Adiabaticity", Journal of Magnetic Resonance, Series A, 120, 133-137 (1996).

Skinner, et al., "Exact Product Operator Evolution of Weakly Coupled Spin-½ ImSn Systems During Arbitrary RF Irradiation of the I Spins", Journal of Magnetic Resonance 141, 271-285 (1999).

Freeman, "A Handbook of Nuclear Magnetic Resonance", Longman Scientific/John Wiley & Sons, NY, Broadband Decoupling pp. 17-26; Coherent Coupling pp. 38-42.

Tycko, "Broadband Population Inversion", Am. Phys. Soc V. 51, N. 9, Aug. 29, 1983, pp. 775-777.

Tycko, et al, "Iterative Schemes for Broad-Band and Narrow-Band Population Inversion in NMR" Elsevier Science Publishers BV, Chemical Physics Letters, V. 111, N.4,5, Nov. 9, 1984 pp. 462-467.

Tannus, et al., "Adiabatic Pulses", NMR in Biomedicine 10, 423-434 (1997) Fujiwara, et al, "Frequency-Switched Composite Pulses for Decouplign Carbon-13 Spins Over Ultrabroad Bandwidths", Journal of Magnetic Resonance, Series A 104, 103-105 (1993).

Baum, et al, "Broadband Population Inversion by Phase Modulated Pulses", J. Chem. Phys. 79(9), Nov. 1, 1983, pp. 4643-4644.

Kupce, et al, "Adiabatic Pulses for Wideband Inversion and Broadband Decoupling", Journal of Magnetic Resonance, Series A, 115, 273-276 (1995).

Fu, et al, "Broadband Decoupling in NMR With Frequency-Modulated "Chirp" Pulses", Elsevier Science Publishers BV, Chemical Physics Letters 245 (1995) 415-420.

Danger, "Efficient FPGA Implementation of Gaussian Noise Generator for Communication Channel Emulation".

Bregni, "Generation of Pseudo-Random Power-Law Noise Sequences by Spectral Shaping".

Kelly, et al., "A Book on C", Benjamin/Cummings Publishing Company, Inc., © 1984 Menlo Pk, CA The Storage Class static 5.11-5.13 pp. 153-155.

* cited by examiner

LOW POWER BROADBAND SPIN DECOUPLING

CROSS REFERENCE TO RELATED APPLICATIONS

This application claims the benefit of U.S. provisional application Ser. No. 60/744,606 filed Apr. 11, 2006, which is incorporated herein by reference.

The following relates to the magnetic resonance arts. It is described with exemplary application to magnetic resonance imaging and spectroscopy applications in which the observation species is a nuclear species such as $^{15}N$, $^{13}C$, or so forth, that is coupled with hydrogen. However, the following is amenable to magnetic resonance imaging and spectroscopy applied to other observe species coupled with hydrogen or other coupled nuclear species, to magnetic resonance imaging and spectroscopy observing the $^1H$ nuclear species coupled with other nuclear species such as $^{15}N$, $^{13}C$, or so forth, and to other like applications.

Typically, magnetic resonance imaging and spectroscopy observes the $^1H$ magnetic resonance, which is typically a relatively strong signal due to the abundance of hydrogen in the human body and in most other magnetic resonant subjects. However, magnetic resonance imaging and spectroscopy has also been applied to observe other nuclear species, such as $^{13}C$, $^{15}N$, $^{31}P$, and so forth. Magnetic resonance observation of these nuclear species is complicated by the typically lower abundance of carbon, nitrogen, phosphorous, or so forth compared with hydrogen, and is further complicated by coupling between these nuclear species and surrounding hydrogen (i.e., proton) nuclei which may be chemically bonded or otherwise coupled with the observed nuclear species. The impact of such coupling is to generate multiplets, such as doublets, triplets, and so forth, in the magnetic resonance spectrum. Such interactions can complicate spectral interpretation, reduce signal strength (which is already typically weak due to the low abundance of the observe nuclear species), and may introduce image artifacts or other degradation.

It is known that these problems can be reduced or eliminated by applying low-power broadband decoupling pulses spectrally centered at about the magnetic resonance frequency of the coupled nuclear species (e.g., $^1H$). Such broadband decoupling is used, for example, to simplify the magnetic resonance spectra by collapsing the multiplet structure due to scalar (J) couplings from chemically bonded protons, and to increase sensitivity via the nuclear Overhauser effect. Broadband decoupling pulses are useful because the multiplets generated by coupling with protons or so forth can span relatively wide frequency ranges. For example, to decouple protons over a typical chemical shift range of 6.5 ppm, the secondary radio frequency irradiation should encompass a decoupling bandwidth of 830 Hz at 3 T (128 MHz $^1H$ magnetic resonance frequency), and should encompass a decoupling bandwidth of 1936 Hz at 7T (298 MHz $^1H$ magnetic resonance frequency). Moreover, because the chemical shift increases with increasing main ($B_0$) magnetic field strength, the requisite bandwidth of the broadband decoupling pulses also increases with increasing $B_0$ field strength.

However, existing broadband decoupling pulses have certain disadvantages. Existing techniques have difficulty reaching the requisite bandwidth, particularly at high $B_0$ magnetic field and/or when decoupling species other than protons from the observe nuclear species. Additionally, existing techniques employ relatively high broadband power, which can lead to problematic tissue heating and elevated SAR. Moreover, the repeated application of broadband decoupling pulses produces artifacts in the form of weak spectral sidebands, known as cycling sidebands, which arise from the temporal periodicity of the sequences and the residual errors in the averaging of the proton spin states. That is, cycling sidebands are caused by a weak secondary modulation of the observe nucleus magnetic resonance signal caused by the periodicity of the decoupling sequence.

In accordance with one aspect, a magnetic resonance data acquisition method is disclosed. Magnetic resonance is excited in an observed nuclear species. Magnetic resonance data of the observed nuclear species are acquired. A plurality of different broadband decoupling radio frequency pulses configured to decouple a coupled nuclear species from the observed nuclear species are applied. The differences between the different broadband decoupling radio frequency pulses are effective to substantially suppress cycling sidebands.

In accordance with another aspect, a magnetic resonance apparatus is disclosed for performing the magnetic resonance data acquisition method set forth in the preceding paragraph.

In accordance with another aspect, a magnetic resonance apparatus is disclosed. A main magnet generates a main magnetic field. A magnetic resonance excitation system is configured to excite magnetic resonance in an observed nuclear species. A magnetic resonance data acquisition system is configured to acquire magnetic resonance data of the observed nuclear species. A decoupling system is configured to successively apply different broadband decoupling radio frequency pulses configured to decouple a coupled nuclear species from the observed nuclear species. The differences between the different broadband decoupling radio frequency pulses are effective to substantially suppress cycling sidebands.

In accordance with another aspect, a decoupling system is disclosed for decoupling a coupled nuclear species from an observed nuclear species. A source provides different broadband decoupling radio frequency pulses each having about the same peak power, pulse duration, and frequency spread. Differences between the provided broadband decoupling radio frequency pulses are effective to substantially suppress cycling sidebands. A radio frequency transmitter is provided for transmitting the provided broadband decoupling radio frequency pulses.

In accordance with another aspect, a magnetic resonance apparatus is disclosed. A main magnet generates a main magnetic field. A magnetic resonance excitation system is configured to excite magnetic resonance in an observed nuclear species. A decoupling system is provided as set forth in the preceding paragraph.

One advantage resides in providing broadband decoupling at reduced power.

Another advantage resides in providing broadband decoupling with reduced SAR.

Another advantage resides in providing broadband decoupling with enhanced bandwidth.

Another advantage resides in providing broadband decoupling with reduced or eliminated cycling sidebands.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 1:
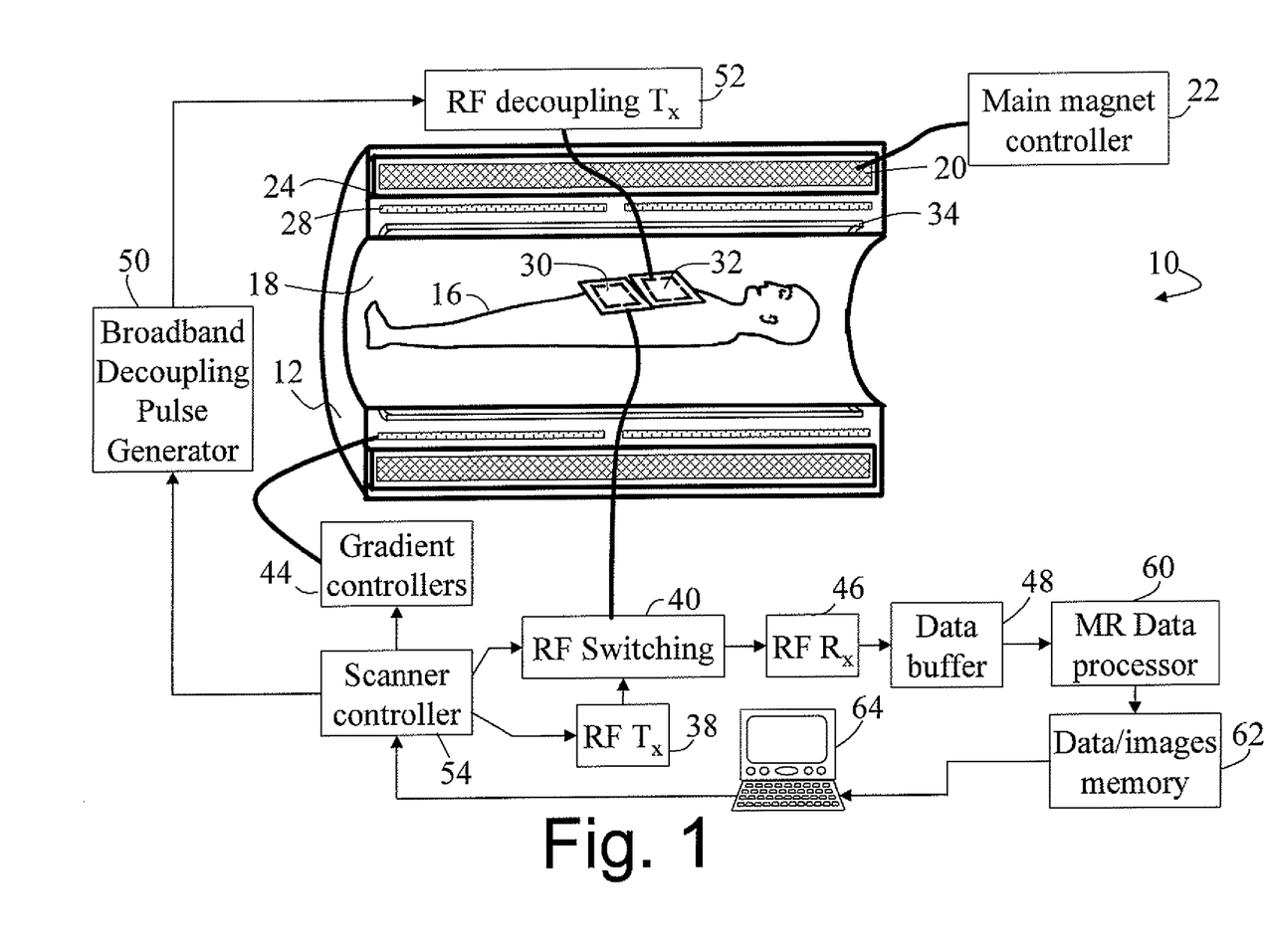
FIG. 1 diagrammatically shows a magnetic resonance scanner system for performing techniques such as magnetic resonance imaging, magnetic resonance spectroscopy, or so forth.

With reference to FIG. 1, a magnetic resonance scanner 10 includes a scanner housing 12 in which a patient 16 or other observed subject is at least partially disposed. A protective insulating bore liner 18 of the scanner housing 12 optionally lines a cylindrical bore or opening of the scanner housing 12 inside of which the observed subject 16 is disposed. A main magnet 20 disposed in the scanner housing 12 is controlled by a main magnet controller 22 to generate a main ($B_0$) magnetic field in at least an observed region of the observed subject 16. Typically, the main magnet 20 is a persistent superconducting magnet surrounded by cryoshrouding 24. In some embodiments, the main magnet 20 generates a main magnetic field of at least about 0.2 Tesla, such as 0.23 Tesla, 1.5 Tesla, 3 Tesla, 7 Tesla, or so forth. Magnetic field gradient coils 28 are arranged in or on the housing 12 to superimpose selected magnetic field gradients on the main magnetic field in at least the observed region of the observed subject 16. Typically, the magnetic field gradient coils include coils for producing three orthogonal magnetic field gradients, such as x-gradients, y-gradients, and z-gradients. At least two radio frequency coils 30, 32 (or alternatively a single coil capable of being tuned to at least two different radio frequencies) are disposed in the bore of the scanner 10.

One or more of the radio frequency coils, namely the local coil 30 in FIG. 1, is used to inject radio frequency excitation pulses at a magnetic resonance frequency of an observed nuclear species and to measure the excited magnetic resonance signals. Optionally, different coils are used for excitation and reading; for example, a whole-body radio frequency coil 34 mounted in the scanner 10 can be used for magnetic resonance excitation at the magnetic resonance frequency of the observed nuclear species, while the local coil 30 can be used for reading the excited magnetic resonance.

Additionally, one or more of the radio frequency coils, namely the local coil 32 in FIG. 1, is used to apply a secondary radio frequency irradiation at the magnetic resonance frequency of a hetero-nuclear species that exhibits coupling with the observed nuclear species. The applied secondary radio frequency irradiation is a relatively broadband excitation used to selectively invert the spin state of the coupled nuclear species or broadband decouple it from the observed nuclear species during data readout.

In this Detailed Description, the example of $^{13}C$ is used as the observed nuclear species, and the example of $^1H$ is used as the chemically bonded or otherwise coupled nuclear species. However, it is to be appreciated that either or both of the observed nuclear species and the coupled nuclear species can be other species. For example, the observed nuclear species can be $^{15}N$ or $^{31}P$ and the coupled nuclear species can be $^1H$. In other configurations, $^1H$ is the observe nuclear species and the decoupled nuclear species are $^{13}C$ or $^{15}P$. For hetero-nuclear spectroscopy, the observed nuclear species and the coupled nuclear species typically have different atomic number (Z) values. For example, carbon has Z=6 while hydrogen has Z=1. The observed and coupled nuclear species can be naturally a part of the subject 16, or can be part of a substance that is administered to the subject 16 by injection, inhalation, ingestion, or so forth.

During magnetic resonance spectroscopy data acquisition, a radio frequency power source or transmitter 38 operating at the magnetic resonance frequency of the observed nuclear species (e.g., $^{13}C$) is coupled to the local coil 30 through radio frequency switching circuitry 40 to inject radio frequency excitation pulses at the magnetic resonance frequency of the observed nuclear species into the observed region of the observed subject 16 so as to excite magnetic resonance in spins of the observed nuclear species (e.g., $^{13}C$). Optionally, a magnetic field gradients controller 44 operates the magnetic field gradient coils 28 to spatially localize the magnetic resonance excitation to a slab or other localized region. The radio frequency power source 38 further operates the local coil 30 to generate one or more spin echoes, for example by applying one or more inversion pulses at the magnetic resonance frequency to invert the excited magnetic resonance of the observed nuclear species so as to generate one or more spin echoes. Optionally, the magnetic field gradient controller 44 operates the magnetic field gradient coils 28 to apply one or more spatial encoding magnetic field gradient pulses. During the magnetic resonance readout phase of the pulse sequence, the switching circuitry 40 disconnects the radio frequency transmitter 38 from the local coil 30, and connects a radio frequency receiver 46 to the local coil 30 to acquire magnetic resonance data from the observed region of the observed subject 16. The acquired magnetic resonance data are stored in a data buffer 48.

A decoupling pulse generator 50 generates radio frequency pulse configurations that are implemented by a second, decoupling radio frequency transmitter 52 operating the local coil 32 to generate a broadband decoupling signal having a broadband spectrum centered at about a magnetic resonance frequency of the coupled nuclear species (e.g., $^1H$). The broadband decoupling is typically applied during readout, such as during sampling of the spin echo or during free induction decay prior to the sampling, to decouple the observed and coupled nuclear species during readout so as to provide cleaner magnetic resonance data from the observation nuclear species (e.g., $^{13}C$) for imaging, spectroscopy, or other applications.

A magnetic resonance data processor 60 performs processing of the magnetic resonance data to extract useful information. In imaging applications, the data processor 60 performs image reconstruction using a Fast Fourier transform or other image reconstruction algorithm comporting with the selected spatial encoding applied during generation of the magnetic resonance data. In spectroscopic applications, processing may include, for example, performing spectral fast Fourier transform operations to recover chemical shift and J-coupling data. The resulting processed data (e.g., images, spectra, or so forth) are suitably stored in a data/images memory 62, displayed on a user interface 64, printed, communicated over the Internet or a local area network, stored on a non-volatile storage medium, or otherwise used. In the example configuration illustrated in FIG. 1, the user interface 64 also interfaces a radiologist or other operator with the scanner controller 54 to control the magnetic resonance scanner 10. In other embodiments, a separate scanner control interface may be provided.

Figure 2:
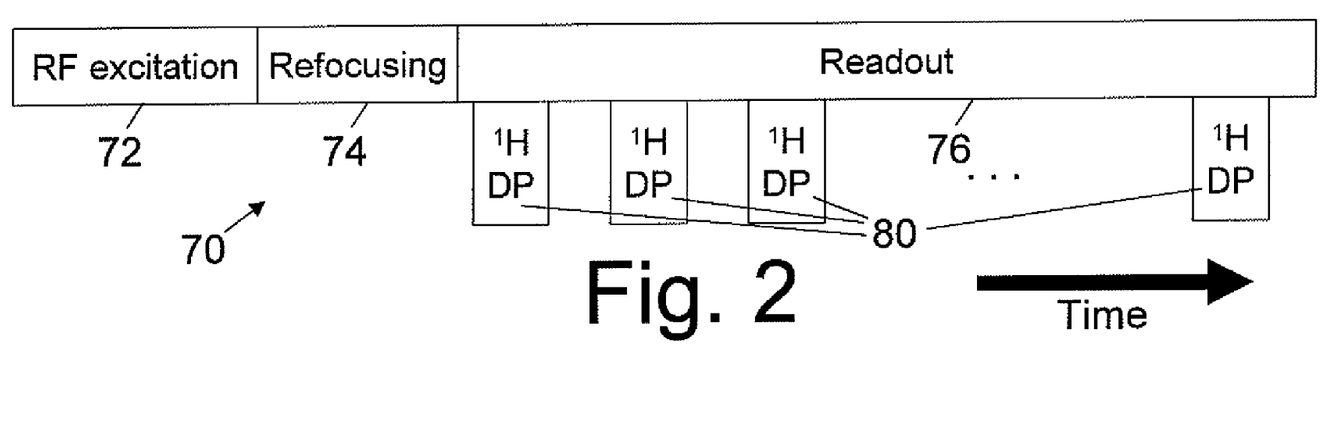
FIG. 2 diagrammatically shows an example magnetic resonance scan 70 operating on the observe nuclear species and including broadband decoupling of a coupled nuclear species.

With continuing reference to FIG. 1 and with further reference to FIG. 2, an example magnetic resonance imaging scan 70 operating on the observe nuclear species (e.g., $^{13}C$) and including decoupling of the coupled nuclear species (e.g., $^{1}H$) is diagrammatically shown. A radio frequency excitation 72 is applied at the magnetic resonance frequency of the observe nuclear species to generate magnetic resonance. Optionally, the radio frequency excitation 72 includes a slice-selective magnetic field gradient to spatially localize the generated magnetic resonance. A refocusing pulse 74 is optionally applied to generate a spin echo, followed by a readout 76 that reads out a set of magnetic resonance samples. In some embodiments, the readout 76 acquires a line of k-space over a relatively extended period of time, such as over 500 milliseconds. During the readout, decoupling pulses 80 are applied by the decoupling system including the decoupling pulse generator 50, the decoupling radio frequency transmitter 52, and the local coil 32. The decoupling pulses 80 are broadband pulses that decouple the coupled nuclear species (e.g., $^{1}H$) from the observe nuclear species (e.g., $^{13}C$). To maintain adequate decoupling, the decoupling pulses 80 are suitably repeated, for example at a repetition rate of every 3 milliseconds with phase shifting of the basic pulse through a periodic phase cycle to compensate for imperfections in the inversion performance of the pulse. In other embodiments, decoupling may be applied elsewhere in the sequence, such as during the interval between the radio frequency excitation 72 and the readout 76.

In the decoupling system embodiments disclosed herein, a plurality of (that is, two or more) broadband decoupling radio frequency pulses are applied that are sufficiently different from one another so as to substantially suppress cycling sidebands that in appear in the observe nuclear spectrum. By varying the detailed shape of the broadband decoupling radio frequency pulses from pulse to pulse or between groups of pulses that form part of the corrective phase cycle, the temporal repetition or periodicity in the secondary modulation induced in the nuclear signal recorded from the observe nucleus that leads to cycling sidebands is reduced. The successive broadband decoupling radio frequency pulses have about the same peak power, pulse duration, and frequency spread, but differ in the details of the amplitude sufficiently to break the decoupling sequence periodicity and consequentially disperse the secondary modulation frequencies of the nuclear signal that lead to cycling sidebands. When the secondary modulation frequencies of the cycling sidebands are sufficiently dispersed these signal components can be reduced close to the level of the spectrum background noise. Accordingly, broadband decoupling is achieved without any substantial unwanted concomitant coherent modulation of the observed nuclear signal.

The inventor has found that using different broadband decoupling pulses, each having about the same peak power, pulse duration, and frequency spread, but differing in the details of the amplitude, can be sufficient to substantially suppress cycling sidebands. For example, different broadband pulses having triangular-shaped, sinusoidal-shaped, tangent-shaped, hyperbolic secant-shaped, or otherwise-shaped amplitude functions can be used, with each different broadband pulse being scaled to have about the same peak power, pulse duration, and frequency spread. Different combinations of two, three, four, or more different decoupling pulses are suitably repeated and phase cycled to span the readout time. Including more different broadband decoupling pulses and varying their temporal order in the decoupling pulse sequence will generally further suppress cycling sidebands.

Figure 3A:
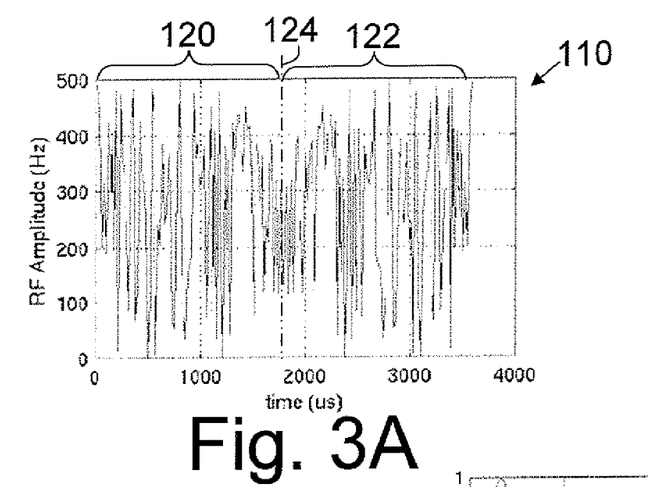
FIGS. 3A and 3B show plots of the amplitude and phase, respectively, of an example random or pseudo-random broadband decoupling pulse.

With reference to FIGS. 3A, 3B, and 3C, a suitable broadband decoupling pulse is described. The broadband decoupling pulse amplitude 110 shown in FIG. 3A is based on a noise signal, such as a randomized or pseudorandomized signal having a Gaussian white noise or uniformly distributed noise component. Since the noise component varies randomly or pseudorandomly while maintaining a constant statistical mean and frequency spectrum, selecting different broadband decoupling pulses with noise-based amplitudes provides the desired condition of each pulse having about the same peak power, pulse duration, and frequency spread, but differing in the details of the amplitude. Typically, the pulse amplitude 110 has principal frequency components at acoustical frequencies, although noise in other spectral ranges can be employed.

Figure 3B:
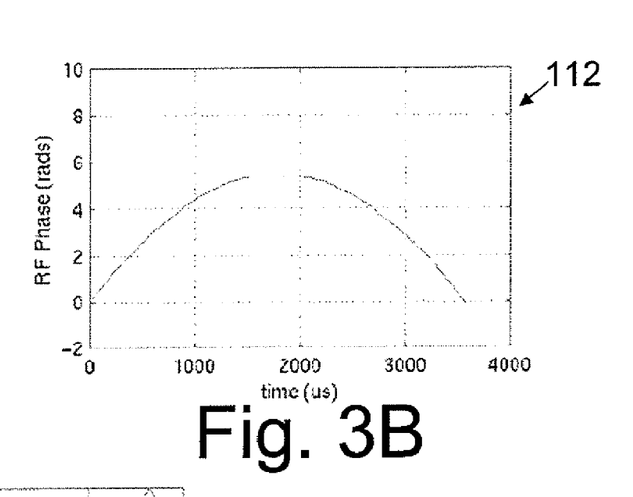

A suitable broadband decoupling pulse phase 112 shown in FIG. 3B is suitably computed from the amplitude 110 to provide the phase-modulated pulse inversion profile 114 shown in FIG. 3C as follows. Representing the amplitude shape of the broadband decoupling pulse by a unit normalized function $F_1(\tau)$, where $0 \leq F_1(\tau) \leq 1$ and $0 \leq \tau \leq 1$, the power is reduced in proportion to the mean square amplitude of the pulse:

$$P_{ms} = \omega_1^2 \int_0^1 F_1^2(\tau) d\tau. \tag{1}$$

For pure amplitude modulation with fixed peak radio frequency field strength ($\omega_1$) the cost of reducing the decoupling power level is seen as a reduction in the component pulse flip angle ($\theta$). To restore this the unit normalized radio frequency pulse $F_1(\tau)$ is suitably lengthened to a value $T_p$ given by:

$$T_p = \frac{\theta}{2\pi\omega_1 \int_0^1 F_1(u) du}, \tag{2}$$

so that a correct flip angle is obtained. A suitable approach for computing the phase 112 is given by A. Tannus & M. Garwood, J. Magn. Reson. vol. 120 A, pages 133-137 (1996):

$$F_2(\tau) = \left[ 1 - 2 \frac{\int_0^\tau F_1^2(u) du}{\int_0^1 F_1^2(u) du} \right], \tag{3}$$

where $F_2(\tau)$ is a unit normalized frequency sweep function obtained from the unit-normalized amplitude function $F_1(\tau)$. The instantaneous frequency $\Delta\omega_0(\tau)$ (in Hz) of the broadband decoupling radio frequency pulses of a decoupling sequence is then modulated as:

$$\Delta\omega(\tau) = \omega_0 F_2(\tau) \qquad (4).$$

The frequency swept modulation $\Delta\omega(\tau)$ given in Equation (4) is equivalent to a phase modulation $\Phi(\tau)$ given by:

$$\phi(\tau) = 2\pi\omega_0 \int_0^\tau F_2(u)du. \qquad (5)$$

Using frequency modulation to spread the power of the broadband decoupling radio frequency pulse reduces the pulse flip angle. According to the theory given by A. Tannus & M. Garwood, supra, the power of the pulse is spread uniformly across the pulse sweep by the modulation design. Accordingly, sweeping over a frequency range $\tilde{\omega} \approx N\omega_1$ is equivalent to applying N extra broadband decoupling radio frequency pulses. To keep a constant flip angle, the broadband decoupling pulse must be lengthened by at least a factor $\tilde{\omega}/\omega_1$ to provide the needed radio frequency power. To obtain 180° pulses the pulse duration $T_p$ should be:

$$T_p \geq \frac{\omega_0}{2\omega_1^2 \int_0^1 F_1(u)du}. \qquad (6)$$

There are no strong constraints upon the form of the amplitude modulation function $F_1(\tau)$. Amplitude modulation with simple continuous curves such as: $\sin(\pi\tau)$ provides a straightforward way to reduce power by trading off pulse duration for power. Using a frequency sweep to improve the decoupling bandwidth also is traded off against pulse duration. Calculations indicate that for sinusoidal modulation over a sweep range with $\tilde{\omega} = 2\omega_1$, the pulse length should increase by a factor of $\pi$. In principle this gives an inversion pulse with roughly the same length as a conventional WALTZ pulse that deposits only 50% of the radio frequency power and yet can potentially cover twice the decoupling bandwidth.

The theory given by A. Tannus & M. Garwood, supra, was derived for simple continuous curves. However, the inventor has found that it can also be applied to more complex amplitude modulations such as uniformly distributed or Gaussian white random or pseudorandom noise to generate appropriate broadband decoupling pulses. For random or pseudorandom noise, the unit normalized function $F_1(\tau) = \text{rand}(\tau)$. For sufficient sampling of the random or pseudorandom noise, the unit normalized frequency sweep function $F_2(\tau)$ is a linear function $F_2(\tau) = 2 - 2\tau$ given by Equation (3). The corresponding unit normalized broadband decoupling pulse phase 112 is given by Equation (5), i.e., $$\phi(\tau) = 2\pi\omega_0 \int_0^\tau (2 - 2u)du = 2\pi\omega_0(2\tau - \tau^2). \qquad (7)$$

Figure 3C:
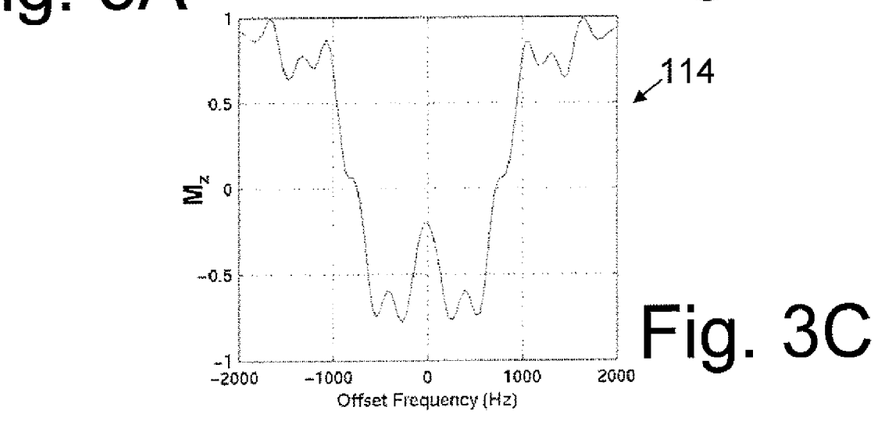
FIG. 3C shows a plot of the phase-modulated pulse inversion profile of the example random or pseudo-random broadband decoupling pulse.

With continuing reference to FIGS. 3A, 3B, and 3C, to ensure an advantageous gain in symmetry over the pulse inversion band, the broadband decoupling pulse amplitude 110 is suitably made mirror-symmetric, for example by combining a noise time interval 120 with a time-reversed version 122 of the same noise time interval 120, so that the broadband decoupling pulse amplitude 110 has reflection symmetry about a temporal midpoint 124 of the decoupling pulse.

Figure 4:
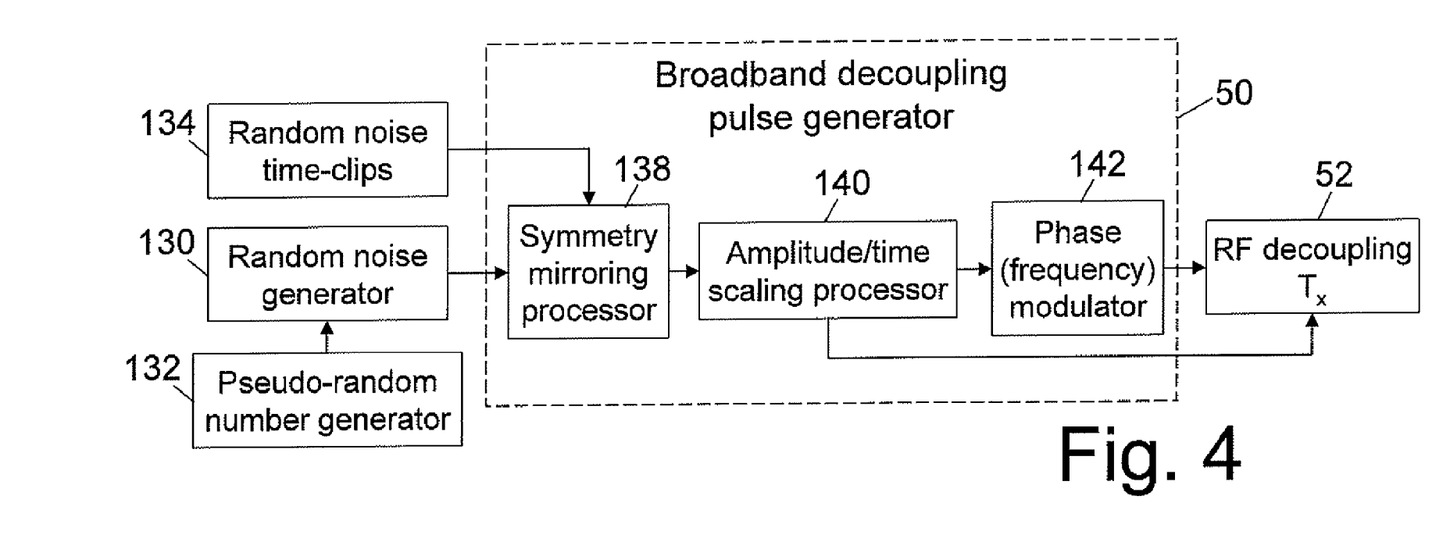
FIG. 4 diagrammatically shows details of the broadband decoupling pulse generator of FIG. 1.

With reference to FIG. 4, an embodiment of the broadband decoupling pulse generator 50 suitable for generating a sequence of broadband decoupling pulses each having a different noise-based amplitude is described. The example broadband decoupling pulse generator 50 obtains a random or pseudorandom signal as a function of time. For example, the output of a random noise generator 130 can be used. In some embodiments, the random noise generator 130 produces a randomized or pseudorandomized signal having a Gaussian white noise or uniformly distributed noise component based on a sequence of random numbers output by a pseudo-random number generator 132. Such an arrangement is readily implemented on existing computers that sometimes include a built-in pseudo-random number generator. However, the random or pseudorandom signal as a function of time can be obtained from other sources, such as a database of random noise time-clips 134 prerecorded from natural randomized sources such as the output of a physical white-noise generator, thermal resistance fluctuations in a resistor, or so forth. In another approach (not shown), the random or pseudorandom signal as a function of time can be obtained by computing a signal having statistical characteristics as a function of time that at least approximate the statistical characteristics of a random or pseudorandom signal as a function of time. As a simple example, a series of amplitude segments that collectively define a linear function, such as a triangle, when applied in serial order, are applied in mixed order to approximate a random or pseudorandom signal.

A symmetry mirroring processor 138 of the broadband decoupling pulse generator 50 optionally combines the obtained noise time interval with a time-reversed version of the same noise time interval to provide an amplitude with bilateral symmetry about a temporal midpoint. An amplitude/time scaling processor 140 scales the amplitude according to Equation (1) and scales the pulse duration according to Equation (2) or Equation (6), so as to make the amplitude 110 (see FIG. 3A) comporting with the desired amplitude and duration of the broadband decoupling pulse to be generated. A phase or frequency modulator 142 computes the phase 112 (see FIG. 33) in accordance with Equations (3)-(5) and (7). The amplitude 110 and phase modulation 112 (or equivalently, frequency modulation) define the broadband radio frequency pulse 80 applied by the decoupling radio frequency transmitter 52 operating the local coil 32.

If the broadband decoupling pulse generator 50 of FIG. 4 outputs each decoupling pulse based on a different portion or interval of noise generated by the random or pseudorandom noise generator 130, it is ensured that each of the broadband decoupling pulses 80 (see FIG. 2) will be different in detail while having about the same peak power, pulse duration, and frequency spread, thus ensuring that cycling sidebands will be substantially suppressed. Indeed, when the broadband decoupling pulse generator 50 of FIG. 4 is applied successively to generate each successive broadband decoupling pulse 80, it is possible that each and every broadband decoupling pulse 80 will differ in detail from each and every other broadband decoupling pulse 80.

However, as noted previously, cycling sidebands are suitably suppressed by using a set of different broadband decoupling pulses, such as a typical twenty different broadband decoupling pulses, or in some embodiments as few as two different broadband decoupling pulses. Such relatively small numbers of different broadband decoupling pulses are amenable to being pre-calculated and stored.

Figure 5:
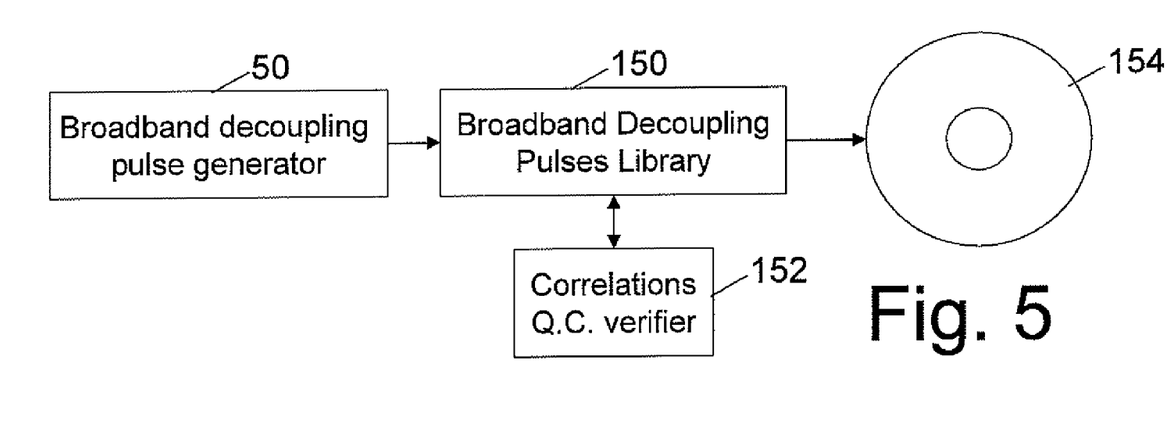
FIG. 5 diagrammatically shows a system for recording a set of suitable random or pseudo-random broadband decoupling pulses for use by a magnetic resonance scanner.

Accordingly, with reference to FIG. 5, in some embodiments the broadband decoupling pulse generator 50 of FIG. 4 is applied to generate a suitable library 150 of different pre-calculated broadband decoupling pulses, such as a library of two different pulses, three different pulses, four different pulses, ten different pulses, twenty different pulses, fifty different pulses, or so forth. Optionally, a correlations quality control verifier 152 checks the pre-calculated pulses to ensure that the pulses are sufficiently different from one another to substantially suppress cycling sidebands. (This condition is typically met by using noise-based pulses; however, if the number of pre-calculated pulses is small, then there may be some possibility that unexpected correlations may exist between one or more pairs of pre-calculated pulses). The library 150 of pre-calculated broadband decoupling pulses is suitably stored on a storage medium 154, such as an optical disk, a magnetic disk, a solid state non-volatile or battery-backed storage device, or so forth. During imaging by the scanner 10 (see FIG. 1), these pre-calculated broadband decoupling pulses are suitably applied in succession by the decoupling radio frequency transmitter 52 operating the local coil 32. In such embodiments, the library 150 of pre-calculated broadband decoupling pulses suitably replaces the broadband decoupling pulse generator 50 in the magnetic resonance scanner 10 of FIG. 1.

Figure 6:
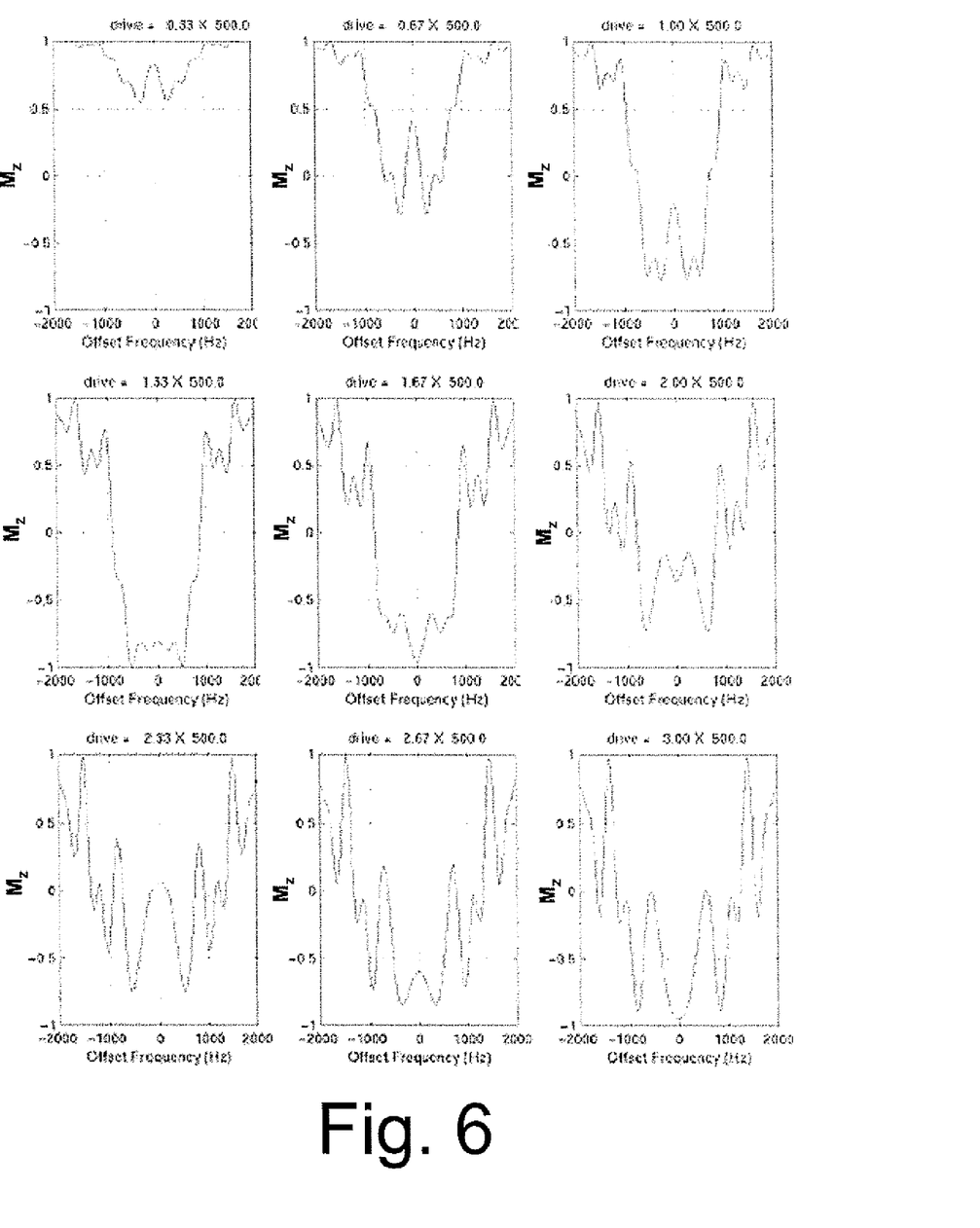
FIG. 6 plots phase-modulated pulse inversion profiles for random or pseudo-random broadband decoupling pulses as a function of radio frequency drive scale.

With reference to FIG. 6, the power scaling performance of random or pseudorandom noise-based broadband decoupling pulses played out a nominal duration was investigated by simulating their inversion profiles as a function of RF drive scale. Power levels above and below the nominal drive were used covering a factor of three in pulse amplitude i.e. 166-1500 Hz. The nominal setting for pulse duration at the nominal RF field strength is reasonably power independent for RF field levels above 500 Hz.

Figure 7:
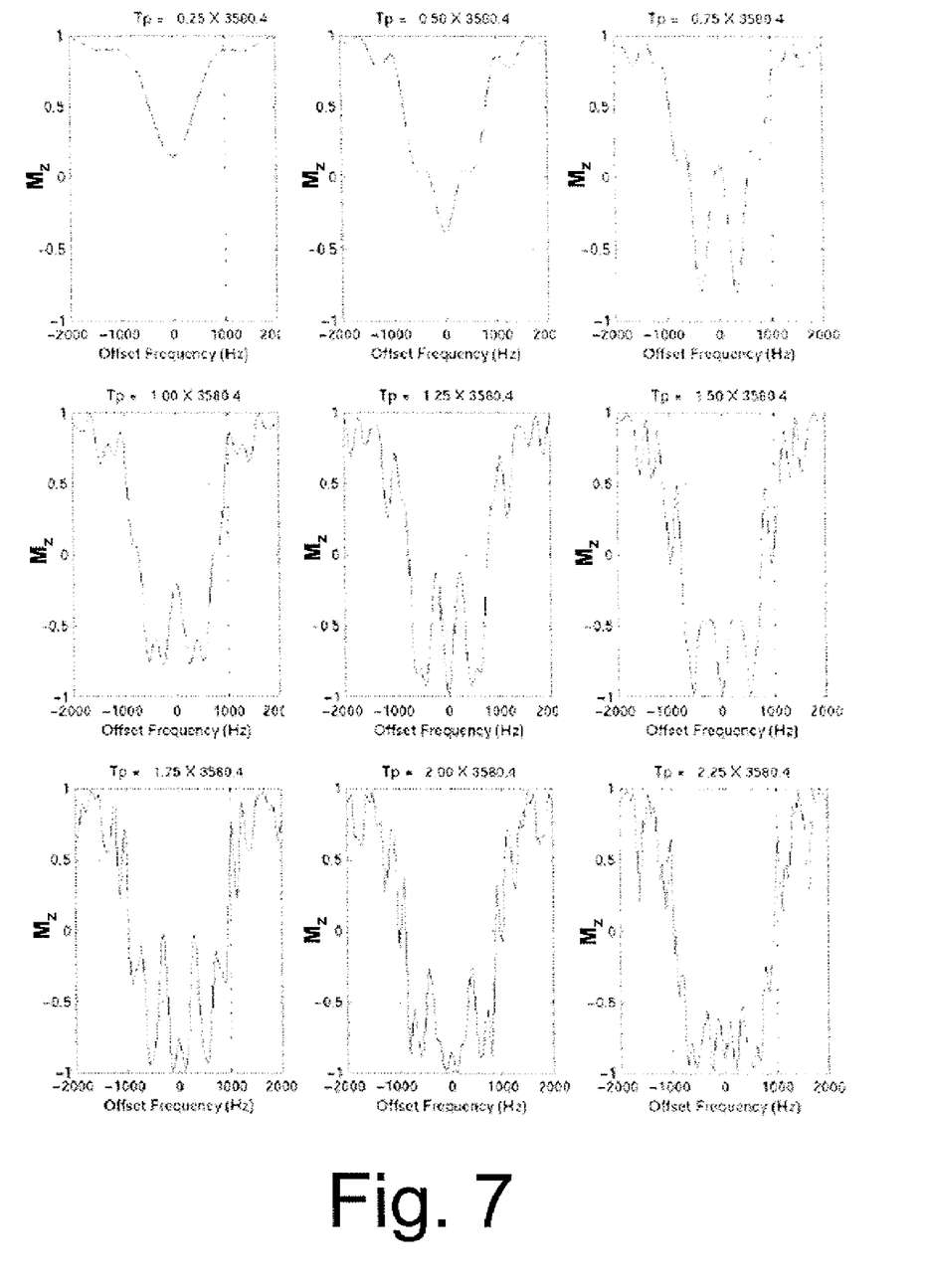
FIG. 7 plots phase-modulated pulse inversion profiles for random or pseudo-random broadband decoupling pulses as a function of pulse duration.

With reference to FIG. 7, the time scaling properties of random or pseudorandom noise-based broadband decoupling pulses played out at the nominal RF field strength was investigated by simulating their inversion profiles as a function of pulse duration. The results of FIG. 7 provides evidence that the nominal RF field strength and nominal pulse lengths used to create each pulse are close to the adiabatic threshold. Reducing pulse length impairs the inversion quality, whilst extending it improves the inversion profile shape without significant changes in the flip angle.

Figure 8:
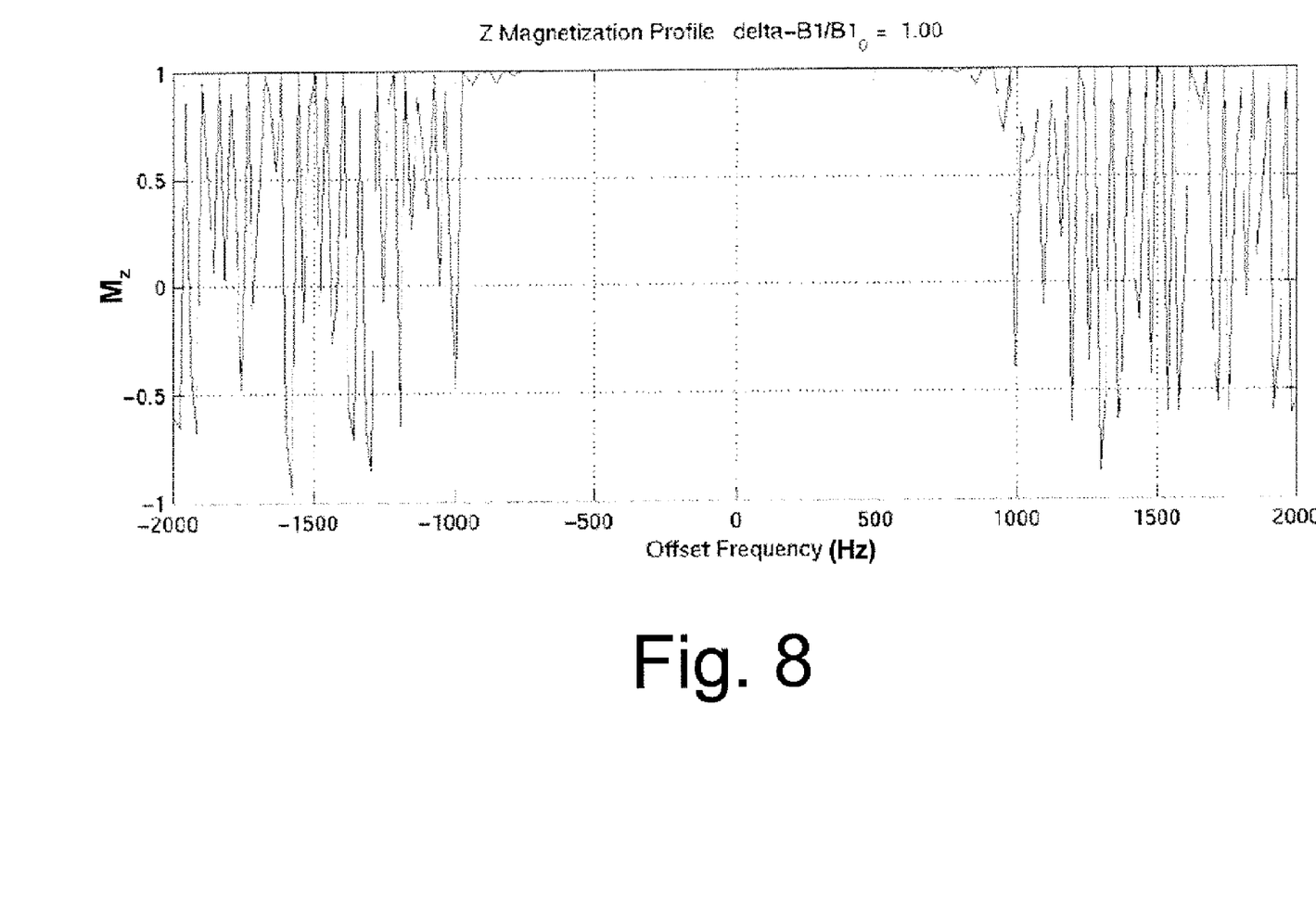
FIG. 8 plots the $M_z$ magnetization profile for a 20 step phase cycle application of noise-based broadband decoupling pulses.
Figure 9:
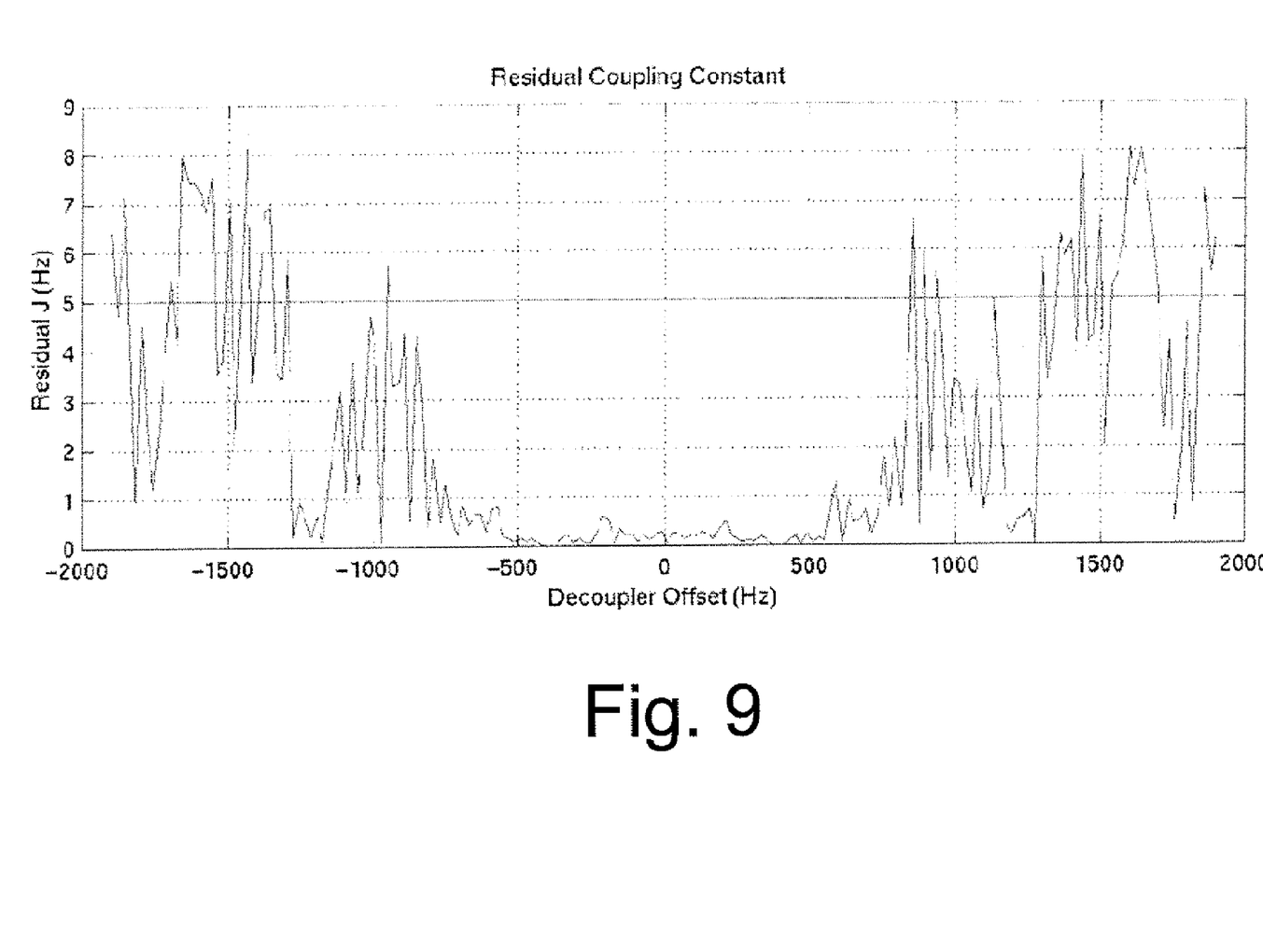
FIG. 9 plots the residual J-coupling for a 20 step phase cycle application of noise-based broadband decoupling pulses.
Figure 10:
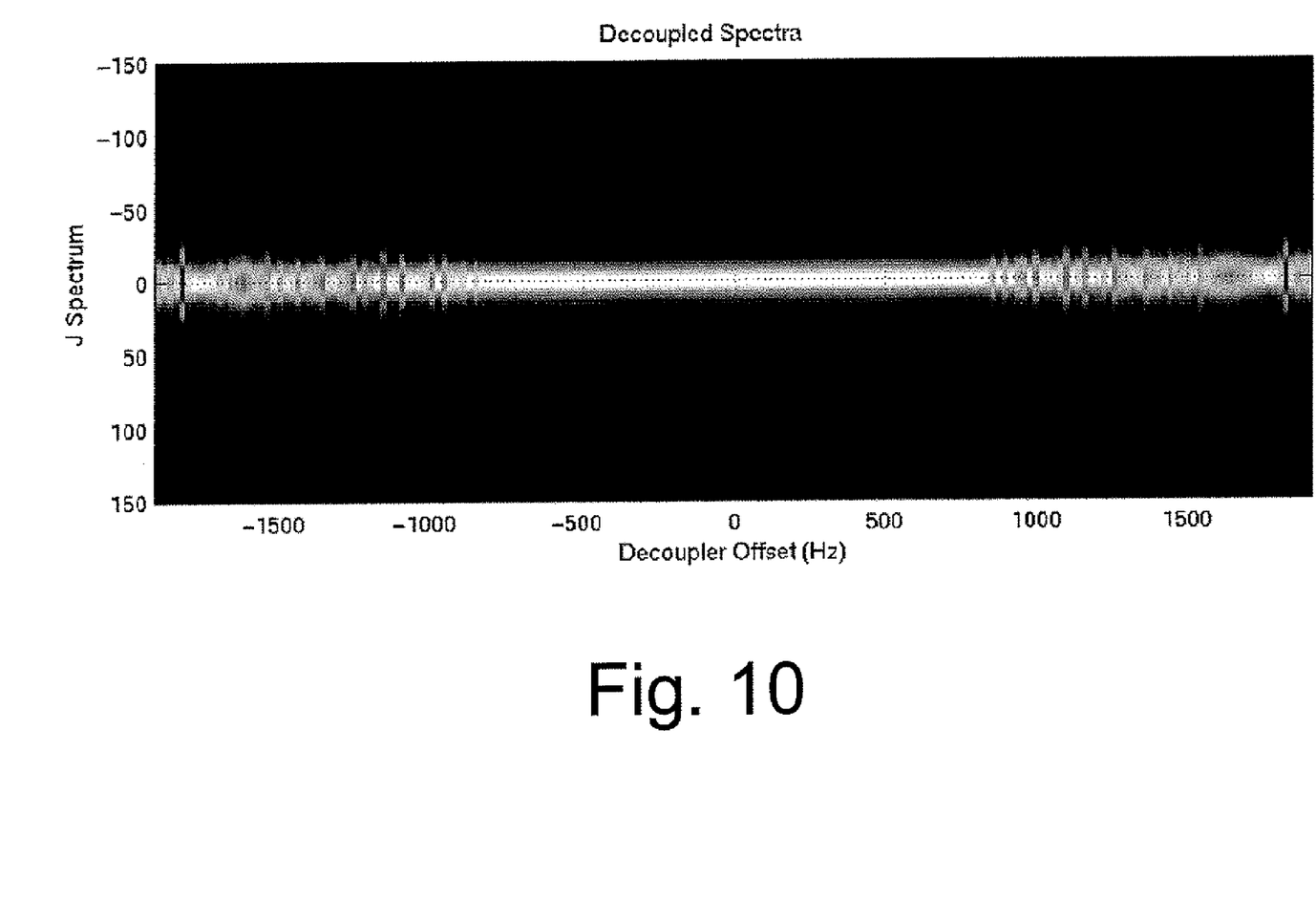
FIG. 10 plots the J-spectrum for a 20 step phase cycle application of noise-based broadband decoupling pulses.

With reference to FIGS. 8-10, a sequence of twenty broadband decoupling radio frequency pulses of the type shown in FIGS. 3A-3C are suitably generated by the broadband decoupling pulse generator 50 of FIG. 4 to simulate the effectiveness of decoupling. FIG. 8 plots the $M_z$ magnetization profile for a twenty step phase cycle application of the noise-based broadband decoupling pulses. A broad decoupling band with near-complete restoration of the longitudinal magnetization ranging from $-1000$ Hz offset to $+1000$ Hz offset is observed. FIG. 9 plots the residual J-coupling for the twenty step phase cycle application of noise-based broadband decoupling pulses. FIG. 10 plots the J-spectrum for the twenty step phase-cycle application of noise-based broadband decoupling pulses. FIGS. 9 and 10 show that J-coupling is substantially suppressed by the sequence of broadband decoupling radio frequency pulses.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance data acquisition method comprising:
    exciting magnetic resonance in an observed nuclear species;
    acquiring magnetic resonance data of the observed nuclear species; and
    applying a plurality of different broadband decoupling radio frequency pulses configured to decouple a coupled nuclear species from the observed nuclear species, wherein each broadband decoupling radio frequency pulse has a randomized or pseudorandomized amplitude as a function of time, the differences between the different broadband decoupling radio frequency pulses being effective to substantially suppress cycling sidebands.

2. The magnetic resonance data acquisition method as set forth in claim 1, wherein the randomized or pseudorandomized amplitude as a function of time of each broadband decoupling radio frequency pulse has a bilateral reflection symmetry.

3. The magnetic resonance data acquisition method as set forth in claim 1, wherein the randomized or pseudorandomized amplitude as a function of time of each broadband decoupling radio frequency pulse includes a Gaussian white noise or uniformly distributed noise component.

4. The magnetic resonance data acquisition method as set forth in claim 1, wherein the randomized or pseudorandomized amplitude as a function of time of each broadband decoupling radio frequency pulse has principal frequency components at acoustical frequencies.

5. The magnetic resonance data acquisition method as set forth in claim 1, wherein the applying of a plurality of different broadband decoupling radio frequency pulses includes:
    applying at least four different pre-recorded broadband decoupling radio frequency pulses; and
    repeating the applying to effectuate decoupling of the coupled nuclear species from the observed nuclear species at least over a duration of the acquiring.

6. The magnetic resonance data acquisition method as set forth in claim 1, wherein the applying includes:
    obtaining a random or pseudorandom signal as a function of time;
    computing a phase as a function of time such that the obtained random or pseudorandom signal and computed phase define one of the broadband decoupling radio frequency pulses; and
    repeating the obtaining and computing to define the plurality of different broadband decoupling radio frequency pulses.

7. The magnetic resonance data acquisition method as set forth in claim 6, wherein the applying further includes:
    reflecting the obtained random or pseudorandom signal to produce a reflection-symmetric random or pseudorandom signal; and
    scaling the obtained random or pseudorandom signal with respect to at least one of time and amplitude such that the defined broadband decoupling radio frequency pulses have about the same peak power and duration.

8. The magnetic resonance data acquisition method as set forth in claim 6, wherein the obtaining of the random or pseudorandom signal as a function of time includes one of:
    recording noise as a function of time;
    generating the random or pseudorandom signal as a function of time by repeated application of a random or pseudorandom number generator; and computing a signal having statistical characteristics as a function of time at that at least approximate statistical characteristics of a random or pseudorandom signal as a function of time.

9. A magnetic resonance apparatus for performing the magnetic resonance data acquisition method as set forth in claim 1.

10. A magnetic resonance apparatus comprising:
a main magnet for generating a main magnetic field;
a magnetic resonance excitation system configured to excite magnetic resonance in an observed nuclear species;
a magnetic resonance data acquisition system configured to acquire magnetic resonance data of the observed nuclear species; and
a decoupling system configured to successively apply different broadband decoupling radio frequency pulses configured to decouple a coupled nuclear species from the observed nuclear species, the differences between the different broadband decoupling radio frequency pulses being effective to substantially suppress cycling sidebands, wherein each broadband decoupling radio frequency pulse has randomized or pseudorandomized amplitude as a function of time.

11. The magnetic resonance apparatus as set forth in claim 10, wherein the decoupling system includes:
a random or pseudorandom signal generator;
a broadband decoupling pulse generator that generates the different broadband decoupling radio frequency pulses from random or pseudorandom signals supplied by the random or pseudorandom signal generator; and
a radio frequency transmitter for selectively transmitting the different generated broadband decoupling radio frequency pulses.

12. The magnetic resonance apparatus as set forth in claim 10, wherein the decoupling system includes:
a storage medium storing a broadband pulses library containing the plurality of different broadband decoupling radio frequency pulses having randomized or pseudorandomized amplitude as a function of time; and
a radio frequency transmitter for transmitting different broadband decoupling radio frequency pulses selected from the broadband pulses database.

13. The magnetic resonance apparatus as set forth in claim 10, wherein the different broadband decoupling radio frequency pulses having randomized or pseudorandomized amplitude as a function of time each have about the same peak power, pulse duration, and frequency spread.

14. A decoupling system for decoupling a coupled nuclear species from an observed nuclear species, the decoupling system comprising:
a source providing different broadband decoupling radio frequency pulses each having about the same peak power, pulse duration, and frequency spread, differences between the provided broadband decoupling radio frequency pulses being effective to substantially suppress cycling sidebands; and
a radio frequency transmitter for transmitting the provided broadband decoupling radio frequency pulses.

15. The decoupling system as set forth in claim 14, wherein the source includes:
a storage medium storing a library of pre-recorded broadband decoupling radio frequency pulses each having about the same peak power, pulse duration, and frequency spread, and further having differences effective to substantially suppress cycling sidebands.

16. The decoupling system as set forth in claim 15, wherein the decoupling system is configured to (i) transmit the pre-recorded broadband decoupling radio frequency pulses, and (ii) repeat the transmit of at least some of the pre-recorded broadband decoupling radio frequency pulses conditional upon the transmitting exhausting the stored supply of pre-recorded broadband decoupling radio frequency pulses.

17. The decoupling system as set forth in claim 14, wherein the source includes:
a broadband decoupling pulse generator that generates different broadband decoupling radio frequency pulses from different portions of noise supplied by a random or pseudorandom signal generator.

18. A magnetic resonance apparatus comprising:
a main magnet for generating a main magnetic field;
a magnetic resonance excitation system configured to excite magnetic resonance in an observed nuclear species;
a decoupling system as set forth in claim 14.

19. The decoupling system as set forth in claim 14, wherein the source provides different bilaterally symmetric broadband decoupling radio frequency pulses each having bilateral reflection symmetry and about the same peak power, pulse duration, and frequency spread.

* * * * *